(12) United States Patent
Joo

(10) Patent No.: US 7,148,109 B2
(45) Date of Patent: Dec. 12, 2006

(54) METHOD FOR MANUFACTURING FLASH MEMORY DEVICE

(75) Inventor: Kwang Chul Joo, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 213 days.

(21) Appl. No.: 10/883,402

(22) Filed: Jun. 30, 2004

(65) Prior Publication Data

US 2005/0186736 A1    Aug. 25, 2005

(30) Foreign Application Priority Data

Feb. 23, 2004    (KR) .................. 10-2004-0011753

(51) Int. Cl.
  *H01L 21/336*    (2006.01)

(52) U.S. Cl. .................. 438/261; 438/910; 257/E21.15

(58) Field of Classification Search .............. 438/260, 438/261, 910, 923; 257/E21.144, E21.15, 257/E21.681
See application file for complete search history.

(56) References Cited

U.S. PATENT DOCUMENTS 6,187,633 B1 *   2/2001   Dong et al. .............. 438/261
6,849,897 B1 *   2/2005   Dong et al. .............. 438/261

* cited by examiner

*Primary Examiner*—Chandra Chaudhari
(74) *Attorney, Agent, or Firm*—Marshall, Gerstein & Borun LLP

(57) ABSTRACT

The present invention discloses a method for manufacturing a flash memory device which can minimize a hole current by impurity diffusion of floating gates, obtain a sufficient capacitance for a cell operation by increasing a breakdown voltage, and improve retention properties of a flash memory cell, by filing up an impurity on the interface between an oxide film and a polysilicon film, by forming the oxide film on the polysilicon film used as the floating gates, doping an impurity into the oxide film, and annealing the oxide film.

24 Claims, 2 Drawing Sheets

METHOD FOR MANUFACTURING FLASH MEMORY DEVICE

BACKGROUND

1. Field of the Invention

The present invention relates to a method for manufacturing a flash memory device, and more particularly to, a method for manufacturing a flash memory device which can minimize a hole current by impurity diffusion of floating gates, obtain a sufficient capacitance for a cell operation by increasing a breakdown voltage, and improve retention properties of a flash memory cell, by filing up an impurity on an oxide film and a polysilicon film, by forming the oxide film on the polysilicon film used as the floating gates, doping an impurity into the oxide film, and annealing the oxide film.

2. Discussion of Related Art

A flash memory device uses a polysilicon film doped with an impurity such as P as floating gates. A cleaning process using HF or a buffered oxide etch (BOE) solution is performed after forming the polysilicon film and before forming a dielectric film. Here, P doped into the polysilicon film is removed. When a cleaning process using a standard clean #1 (SC-1) solution is performed, a natural oxide film is grown on the polysilicon film. The natural oxide film rarely contains P. Therefore, P of the polysilicon film is diffused into the natural oxide film in a succeeding annealing process. On the other hand, when the polysilicon film is doped with P after the cleaning process using HF, a buffer layer for preventing diffusion of P is not formed, and thus P is diffused in a succeeding annealing process.

In the case that the flash memory device is manufactured according to a general method, a margin of a breakdown voltage is deficient, and thus a thickness of the dielectric film is not reduced. In addition, when the floating gates are formed into a merged PIN/Schottky structure (MPS) to improve a capacitance and a surface area of the MPS is increased, the breakdown voltage sharply decreases. After an etching process for forming a gate, the sides of the gate are oxidized at a predetermined thickness to buffer a stress caused by the etching process. However, an oxide film is grown on the interface between the polysilicon film and a lower oxide film of the dielectric film due to the oxidation process, and thus an effective oxide film thickness Teff of the dielectric film is different at the inside and outside of the gate. That is, the effective oxide film thickness Teff is not uniform. Moreover, the dielectric film is thickened to increase the effective oxide film thickness Teff and reduce the capacitance. Such irregular oxidation causes leakage and reduces the breakdown voltage, which has the detrimental effects on the cell operation.

SUMMARY OF THE INVENTION

One object of the present invention is to provide a method for manufacturing a flash memory device which can solve the above problems by preventing external diffusion of an impurity doped into a polysilicon film used as floating gates.

Another object of the present invention is to provide a method for manufacturing a flash memory device which can solve the above problems by filing up an impurity on the interface between a polysilicon film and an oxide film, by forming the thin oxide film on the polysilicon film used as floating gates, doping the impurity into the oxide film, and annealing the oxide film.

One aspect of the present invention is to provide a method for manufacturing a flash memory device, including the steps of: forming a tunnel oxide film and a first polysilicon film on a semiconductor substrate; forming an oxide film on the first polysilicon film; filing up an impurity on the interface between the first polysilicon film and the oxide film, by doping the impurity into the oxide film and annealing the oxide film; forming a dielectric film on the oxide film; and forming a second polysilicon film and a tungsten silicide film over the resulting structure, and performing an etching process thereon.

According to another aspect of the present invention, a method for manufacturing a flash memory device includes the steps of: forming a tunnel oxide film and a first polysilicon film on a semiconductor substrate; forming an oxide film on the first polysilicon film; nitrifying the top surface of the oxide film by doping an impurity into the oxide film and annealing the oxide film in a nitrogen atmosphere, and filing up the impurity on the interface between the first polysilicon film and the oxide film; forming a dielectric film on the oxide film, and steam-annealing the dielectric film; and forming a second polysilicon film and a tungsten silicide film over the resulting structure, and performing an etching process thereon.

The oxide film is a natural oxide film grown when the first polysilicon film is cleaned by using SC-1, or is formed according to a dry oxidation or wet oxidation method.

The dry oxidation process is performed for 3 to 120 minutes at a temperature of 500 to 800° C. under a pressure of 0.05 to 760 Torr in a gas atmosphere including molecules containing oxygen atoms.

The gases including the molecules containing the oxygen atoms include $O_2$, $N_2O$, $NO$, $O_3$ and $H_2O$. The gases are individually used or mixed at a predetermined ratio. If necessary, Ar is further mixed.

The wet oxidation process is performed for 1 to 30 minutes at a normal temperature or a temperature of 80° C. in an aqueous solution obtained by mixing $NH_4OH$ and $H_2O_2$ at a predetermined ratio.

The oxide film has a thickness of 5 to 25 Å.

The impurity is doped in a gas atmosphere including elements having a higher valence than silicon.

The gases including the elements having a higher valence than silicon include $PH_3$ and $AsH_3$. The gases are individually used or mixed at a predetermined ratio. If necessary, Ar is further mixed.

The annealing process is performed as an in-situ process after doping the impurity.

The annealing process is performed for 3 to 180 minutes at a temperature of 500 to 800° C. under a pressure of 0.05 to 760 Torr in $NH_3$ atmosphere.

DETAILED DESCRIPTION OF PREFERRED EMBODIMENTS

Figure 1A:
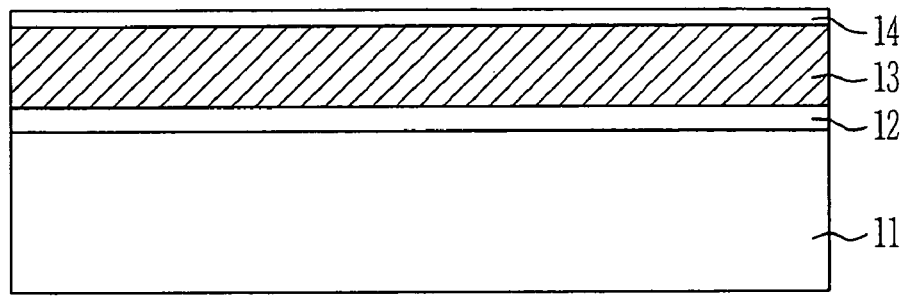
FIGS. 1A to 1E are cross-sectional diagrams illustrating sequential steps of a method for manufacturing a flash memory device in accordance with a preferred embodiment of the present invention.

A method for manufacturing a flash memory device in accordance with a preferred embodiment of the present invention will now be described in detail with reference to the accompanying drawings. Wherever possible, the same reference numerals will be used throughout the drawings and the description to refer to the same or like parts.

FIGS. 1A to 1E are cross-sectional diagrams illustrating sequential steps of the method for manufacturing the flash memory device in accordance with the preferred embodiment of the present invention.

Referring to FIG. 1A, a tunnel oxide film 12 and a first polysilicon film 13 are formed on a semiconductor substrate 11. An impurity is doped into the first polysilicon film 13. An oxide film 14 is formed on the first polysilicon film 13. Here, 1E20 to 5E21 $cm^{-3}$ of P or As is doped into the first polysilicon film 13. The first polysilicon film 13 is formed by forming a doped polysilicon film or an undoped polysilicon film, and additionally doping an impurity in a P or As atmosphere, for example, $PH_3$ or $AsH_3$ atmosphere according to a plasma or annealing process. The surface of the undoped polysilicon film can be curved. On the other hand, the oxide film 14 is a natural oxide film grown when the first polysilicon film 13 is cleaned by using SC-1, or is formed according to a dry oxidation or wet oxidation method. The oxide film 14 using the dry oxidation process is formed by cleaning the first polysilicon film 13 by using, for example, HF or BOE, and annealing the first polysilicon film 13 for 3 to 120 minutes at a temperature of 500 to 800° C. under a pressure of 0.05 to 760 Torr in a gas atmosphere including molecules containing oxygen atoms. Here, the gases including the molecules containing the oxygen atoms include $O_2$, $N_2O$, NO, $O_3$ and $H_2O$. The gases are individually used or mixed at a predetermined ratio. If necessary, Ar which is an inert gas is additionally mixed. The oxide film 14 using the wet oxidation process is formed by processing the first polysilicon film 13 for 1 to 30 minutes at a normal temperature or a temperature of 80° C. in an aqueous solution obtained by mixing $NH_4OH$ and $H_2O_2$ at a predetermined ratio. The oxide film 14 has a thickness of 5 to 25 Å.

Figure 1B:
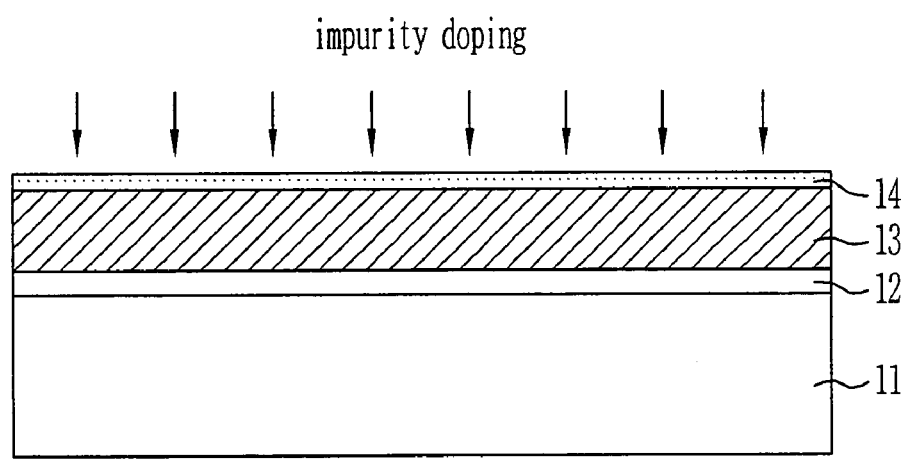

As illustrated in FIG. 1B, an impurity is doped into the oxide film 14 by performing an annealing process in a gas atmosphere including elements having a higher valence than silicon. Here, the gases including the elements having a higher valence than silicon include $PH_3$ and $AsH_3$. The gases are individually used or mixed at a predetermined ratio. If necessary, Ar which is an inert gas is additionally mixed.

Figure 1C:
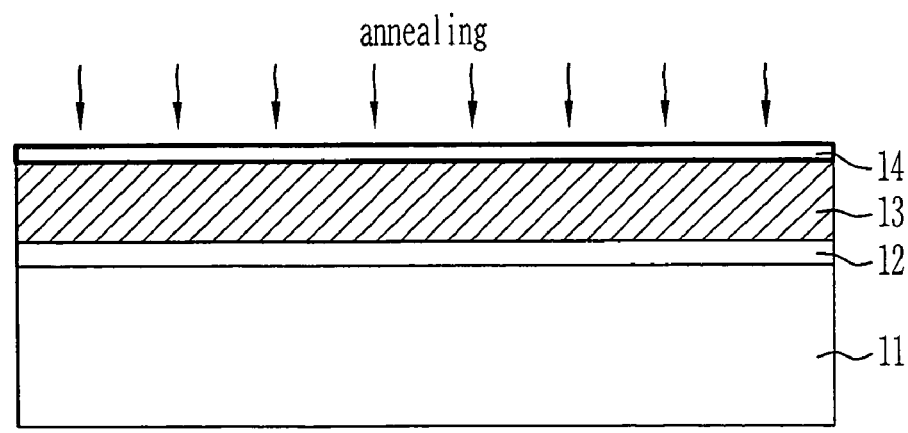

As shown in FIG. 1C, after the impurity is doped into the oxide film 14, the top surface of the oxide film 14 is nitrified by performing an annealing process in $NH_3$ atmosphere as consecutive in-situ processes, and an impurity is filed up on the interface between the oxide film 14 and the first polysilicon film 13. Here, the annealing process is performed for 3 to 180 minutes at a temperature of 500 to 800° C. under a pressure of 0.05 to 760 Torr.

Figure 1D:
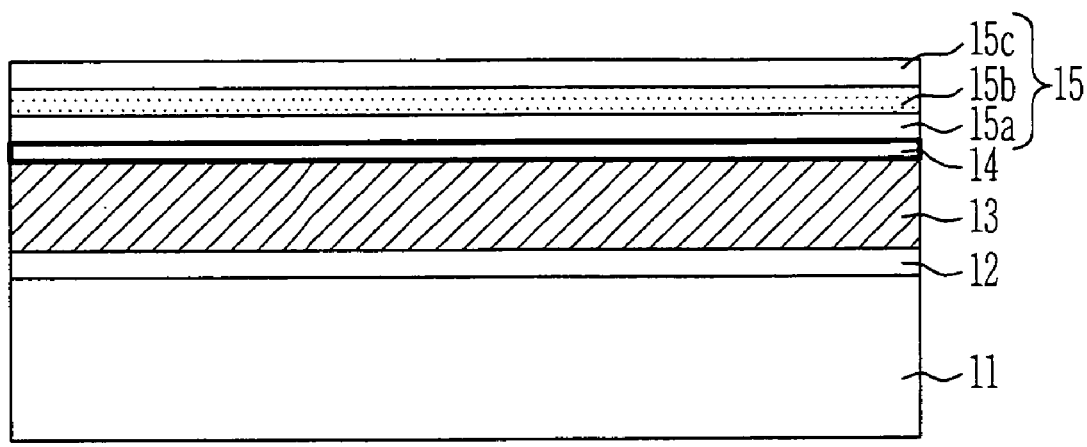

As depicted in FIG. 1D, a dielectric film 15 including a lower oxide film 15a, a nitride film 15b and an upper oxide film 15c is formed over the resulting structure. Here, the lower oxide film 15a and the upper oxide film 15c are formed at a thickness of 30 to 100 Å according to a chemical vapor reaction using a mixed gas of $SiH_4$ and $N_2O$ or a mixed gas of $SiH_2Cl_2$ and $N_2O$ at a temperature of 700 to 900° C. under a pressure of 0.05 to 3 Torr. On the other hand, in order to restrict oxidation of the surface of the first polysilicon film 13, the lower oxide film 15a and the upper oxide film 15c are formed under the above conditions, by loading a wafer to a reaction furnace maintaining a low temperature below 300° C. In addition, the nitride film 15b is formed according to a chemical vapor reaction using a mixed gas of $SiH_4$ and $NH_3$ or a mixed gas of $SiH_2Cl_2$ and $NH_3$ at a temperature of 600 to 800° C. under a pressure of 0.05 to 3 Torr, or formed by nitrifying the surface of the lower oxide film 15a by using a single gas of $NH_3$, a mixed gas of $NH_3$ and Ar, or a mixed gas of $NH_3$ and $N_2$ at a temperature of 600 to 800° C. under a pressure of 20 to 760 Torr. Here, the nitride film 15b is formed at a thickness of 30 to 100 Å. The nitride film 15b can also be formed by forming a primary nitride film by nitrifying the lower oxide film 15a, and forming a secondary nitride film according to a chemical vapor reaction. In order to improve quality of the dielectric film 15 and interface properties of each layer of the dielectric film 15, a steam annealing process is performed for 3 to 120 minutes at a temperature of 750 to 850° C. under a pressure of 0.05 to 760 Torr by using a gas including molecules containing oxygen atoms. Here, the gases including the molecules containing the oxygen atoms include $O_2$, $N_2O$, NO, $O_3$ and $H_2O$. The gases are individually used or mixed at a predetermined ratio. If necessary, Ar which is an inert gas is additionally mixed. On the other hand, the steam annealing process of the dielectric film 15 is performed on a single crystal wafer cleaned in an aqueous solution containing HF to grow the oxide film 14 at a thickness of 50 to 500 Å.

Figure 1E:
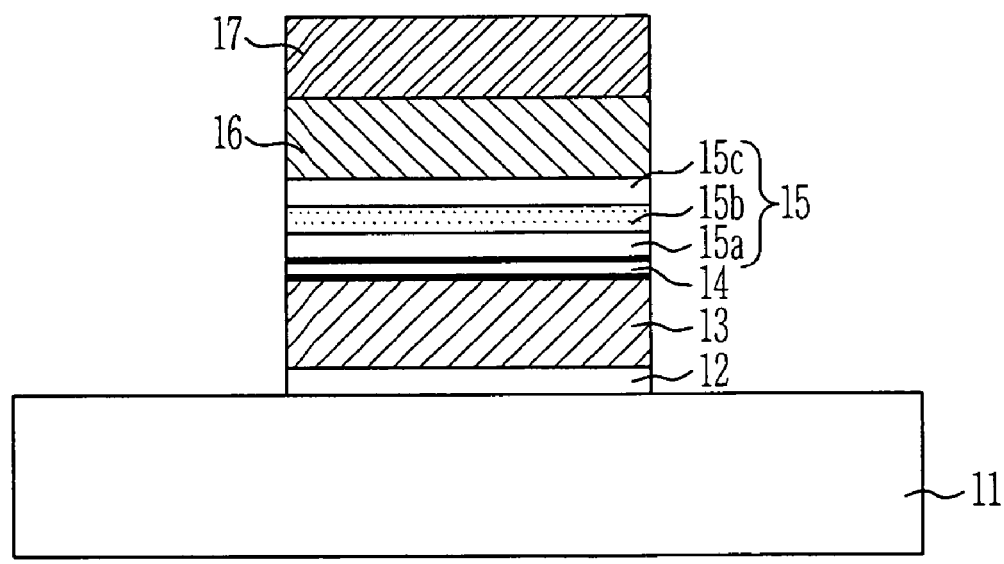

As illustrated in FIG. 1E, a second polysilicon film 16 and a tungsten silicide film 17 are formed over the resulting structure. Thereafter, a gate is formed by performing an etching process.

In the series of processes between the process for forming the oxide film 14 and the steam annealing process of the dielectric film 15, each process must be performed within 12 hours from the preceding process.

As discussed earlier, in accordance with the present invention, the method for manufacturing the flash memory device files up the impurity on the oxide film and the first polysilicon film, by forming the oxide film on the first polysilicon film used as the floating gates, doping the impurity into the oxide film and annealing the oxide film. As a result, the breakdown voltage of the dielectric film is more improved than the dielectric film of the same thickness. Arithmetically, a low thickness of dielectric film can be used. In addition, the oxide film improves interference properties to the first polysilicon film. Therefore, even if an MPS is used to increase a capacitance, the breakdown voltage is not reduced, and a margin for lowering a target of the steam annealing process for obtaining the breakdown voltage after forming the dielectric film is obtained. Accordingly, characteristics of a capacitor including floating gates, a dielectric film and control gates can be maximized and optimized by doping the second polysilicon film for forming the control gates at a high density. Thus, the oxide-nitride-oxide (ONO) dielectric film can be broadly applied to the design rule of 0.09 μm and 0.07 μm as well as the design rule of 0.12 μm. On the other hand, the present invention can be implemented by using the general equipment, which cuts down investment expenses for new equipment.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for manufacturing a flash memory device, comprising the steps of:

forming a tunnel oxide film and a first polysilicon film on a semiconductor substrate;

forming an oxide film on the first polysilicon film;

distributing an impurity along the interface between the first polysilicon film and the oxide film by doping the impurity into the oxide film and annealing the oxide film;

forming a dielectric film on the oxide film; and forming a second polysilicon film and a tungsten silicide film over the resulting structure, and performing an etching process thereon.

2. The method of claim 1, wherein the first polysilicon film comprises 1E20 cm$^{-3}$ to 5E21 cm$^{-3}$ of a dopant selected from the group consisting of P and As.

3. The method of claim 1, wherein the step of forming the first polysilicon film comprises forming a doped polysilicon film or forming an undoped polysilicon film and then doping the undoped polysilicon film with a dopant selected from the group consisting of P and As according to a plasma process or an annealing process.

4. The method of claim 1, wherein the first polysilicon film comprises a merged PIN/Schottky structure.

5. The method of claim 1, wherein the step of forming the oxide film comprises cleaning the first polysilicon film with a standard clean #1 solution, a dry oxidation process, or a wet oxidation process.

6. The method of claim 5, wherein the dry oxidation process is performed for 3 to 120 minutes at a temperature of 500 to 800° C. under a pressure of 0.05 to 760 Torr in a gas atmosphere comprising oxygen-containing molecules.

7. The method of claim 6, wherein: (a) the oxygen-containing molecules are selected from the group consisting of $O_2$, $N_2O$, NO, $O_3$, $H_2O$, and combinations thereof; and, (b) the gas atmosphere optionally comprises Ar.

8. The method of claim 5, wherein the wet oxidation process is performed for 1 to 30 minutes at a normal temperature or a temperature of 80° C. in an aqueous solution obtained by mixing $NH_4OH$ and $H_2O_2$ at a predetermined ratio.

9. The method of claim 1, wherein the oxide film has a thickness of 5 to 25Å.

10. The method of claim 1, wherein the impurity is doped in a gas atmosphere including elements having a higher valence than silicon.

11. The method of claim 10, wherein: (a) the elements having a higher valence than silicon comprise a member selected from the group consisting of P in the form of $PH_3$ and As in the form of $AsH_3$, and (b) the gas atmosphere optionally comprises Ar.

12. The method of claim 1, wherein the annealing process is performed as an in-situ process after doping the impurity.

13. The method of claim 1, wherein the annealing process is performed for 3 to 180 minutes at a temperature of 500 to 800° C. under a pressure of 0.05 to 760 Torr in $NH_3$ atmosphere.

14. The method of claim 1, wherein the dielectric film has a stacked structure of a lower oxide film, a nitride film and an upper oxide film.

15. The method of claim 14, wherein the lower oxide film and the upper oxide film are formed according to a chemical vapor reaction using a mixed gas of $SiH_4$ and $N_2O$ or a mixed gas of $SiH_2Cl_2$ and $N_2O$ at a temperature of 700 to 900° C. under a pressure of 0.05 to 3 Torr.

16. The method of claim 14, wherein the nitride film is formed according to a chemical vapor reaction using a mixed gas of $SiH_4$ and $NH_3$ or a mixed gas of $SiH_2Cl_2$ and $NH_3$ at a temperature of 600 to 800° C. under a pressure of 0.05 to 3 Torr.

17. The method of claim 14, wherein the nitride film is formed by nitrifying the surface of the lower oxide film by using a single gas of $NH_3$, a mixed gas of $NH_3$ and Ar, or a mixed gas of $NH_3$ and $N_2$ at a temperature of 600 to 800° C. under a pressure of 20 to 760 Torr.

18. The method of claim 14, wherein the nitride film comprises a primary nitride film formed by nitrifying the lower oxide film and a secondary nitride film formed by a chemical vapor reaction.

19. The method of claim 1, further comprising a steam annealing process after forming the dielectric film.

20. The method of claim 19, wherein the steam annealing process is performed for 3 to 120 minutes at a temperature of 750 to 850° C. under a pressure of 0.05 to 760 Torr by using a gas comprising oxygen-containing molecules.

21. The method of claim 20, wherein: (a) the oxygen-containing molecules are selected from the group consisting of $O_2$, $N_2O$, NO, $O_3$, $H_2O$, and combinations thereof; and, (b) the gas optionally comprises Ar.

22. The method of claim 19, wherein the steam annealing process is performed on a single crystal wafer cleaned in an aqueous solution containing HF to grow the oxide film at a thickness of 50 to 500Å.

23. A method for manufacturing a flash memory device, comprising the steps of:

forming a tunnel oxide film and a first polysilicon film on a semiconductor substrate;

forming an oxide film on the first polysilicon film;

nitrifying the top surface of the oxide film by doping an impurity into the oxide film and annealing the oxide film in a nitrogen atmosphere, thereby distributing the impurity along the interface between the first polysilicon film and the oxide film;

forming a dielectric film on the oxide film, and steam-annealing the dielectric film; and forming a second polysilicon film and a tungsten silicide film over the resulting structure, and performing an etching process thereon.

24. The method of claim 23, wherein, each step between the step for forming the oxide film and the step for steam annealing the dielectric film, is performed within 12 hours from the preceding step.

* * * * *